(12) United States Patent
Takayama et al.

(10) Patent No.: US 8,682,197 B2
(45) Date of Patent: Mar. 25, 2014

(54) HIGH VOLTAGE POWER SUPPLYING APPARATUS AND IMAGE FORMING APPARATUS HAVING THE SAME

(75) Inventors: Yuuji Takayama, Suntou-gun (JP); Atsuhiko Yamaguchi, Izu (JP)

(73) Assignee: Canon Kabushiki Kaisha, Tokyo (JP)

( * ) Notice: Subject to any disclaimer, the term of this patent is extended or adjusted under 35 U.S.C. 154(b) by 289 days.

(21) Appl. No.: 12/959,758

(22) Filed: Dec. 3, 2010

(65) Prior Publication Data
US 2011/0142478 A1 Jun. 16, 2011

(30) Foreign Application Priority Data

Dec. 10, 2009 (JP) ................................. 2009-280951
Nov. 24, 2010 (JP) ................................. 2010-261727

(51) Int. Cl.
*G03G 15/00* (2006.01)

(52) U.S. Cl.
USPC .................. 399/88; 399/37; 399/55; 399/50; 399/314

(58) Field of Classification Search
USPC .................................. 399/37, 50, 55, 88, 314
See application file for complete search history.

(56) References Cited

U.S. PATENT DOCUMENTS 8,213,823 B2 * 7/2012 Yamamoto ...................... 399/88
2006/0222398 A1 * 10/2006 Nagasaki et al. ............... 399/88
2006/0273688 A1 * 12/2006 Yasukawa et al. ............ 310/318
2009/0045697 A1   2/2009 Kondo
2010/0202794 A1 * 8/2010 Kosaka et al. .................. 399/88

FOREIGN PATENT DOCUMENTS

| CN | 1770583 A | 5/2006 |
|---|---|---|
| CN | 1908823 A | 2/2007 |
| JP | 11-206113 A | 7/1999 |
| JP | 2006-091757 A | 4/2006 |
| JP | 2008-224778 A | 9/2008 |
| JP | 2009-128416 A | 6/2009 |

OTHER PUBLICATIONS

Office Action dated Mar. 21, 2013, in counterpart Chinese Patent Application No. 201010591948.0.

* cited by examiner

*Primary Examiner* — Walter L Lindsay, Jr.
*Assistant Examiner* — Roy Y Yi
(74) *Attorney, Agent, or Firm* — Fitzpatrick, Cella, Harper & Scinto

(57) ABSTRACT

In a high voltage power supplying apparatus, a pulse generation unit generates a pulse signal with a predetermined frequency. A piezoelectric transformer outputs a voltage in accordance with the frequency of the pulse signal. A detection unit detects an output voltage of the piezoelectric transformer. A control unit controls the pulse generation unit to change the frequency of the pulse signal by a predetermined value towards a frequency corresponding to a target voltage until the output voltage becomes equal to the target voltage. A storage unit stores data indicating the frequency when the output voltage reaches the target voltage. The control unit controls the output voltage to be equal to the target voltage by variably controlling the frequency of the pulse signal by a value smaller than the predetermined frequency from the frequency corresponding to the data stored in the storage unit.

20 Claims, 3 Drawing Sheets

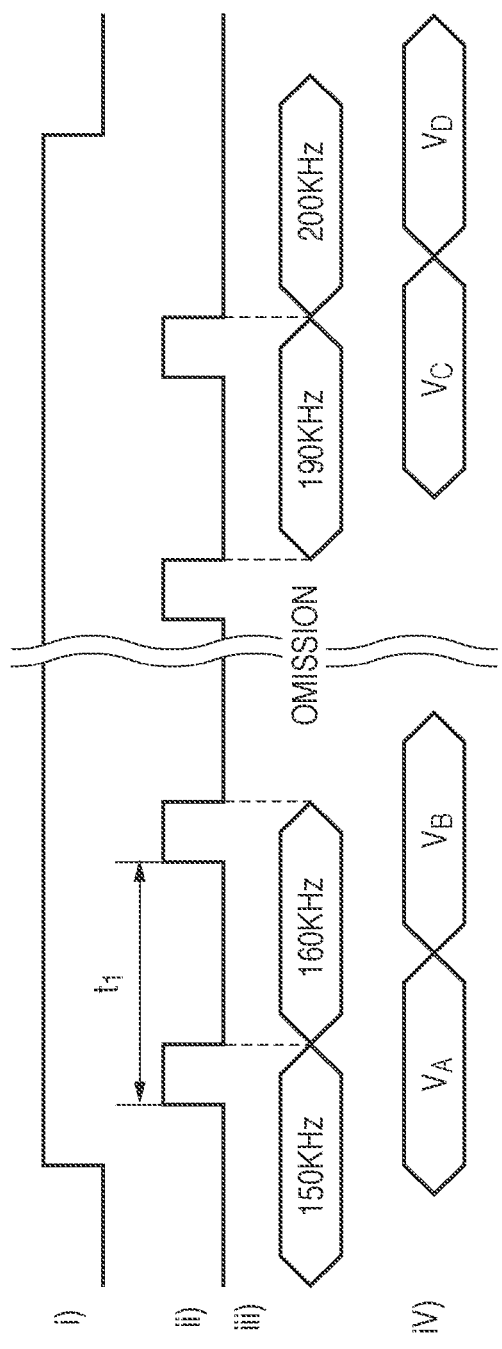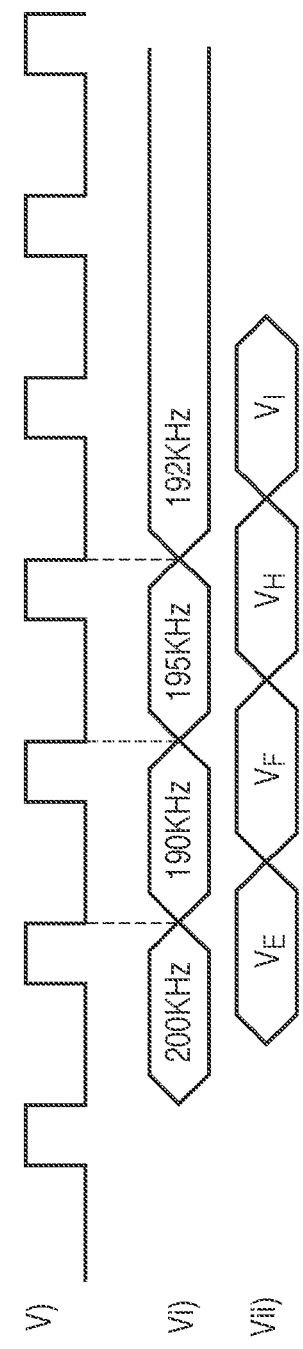
FIG. 2A
FIG. 2B

HIGH VOLTAGE POWER SUPPLYING APPARATUS AND IMAGE FORMING APPARATUS HAVING THE SAME

BACKGROUND OF THE INVENTION

1. Field of the Invention

The present invention generally relates to a high voltage power supplying apparatus using a piezoelectric transformer, and particularly relates to an image forming apparatus using the high voltage power supplying apparatus.

2. Description of the Related Art

An electrophotographic image forming apparatus needs a high voltage power supplying apparatus to generate a voltage (high voltage) higher than several hundred V. This is because the image forming apparatus applies a DC bias voltage to a transfer member. Although a conventional high voltage power supplying apparatus uses a wire-wound electromagnetic transformer, a recent high voltage power supplying apparatus uses a piezoelectric transformer (piezoelectric ceramic transformer).

Japanese Patent Laid-Open No. 11-206113 discloses a high voltage power supplying apparatus having a voltage-controlled oscillator (VCO) that generates a frequency to be input to a piezoelectric transformer. The piezoelectric transformer has a characteristic that an output voltage is maximum at a resonance frequency. The high voltage power supplying apparatus described in Japanese Patent Laid-Open No. 11-206113 controls the output voltage of the piezoelectric transformer by controlling a frequency output from the VCO.

In general, to increase the output voltage of the piezoelectric transformer, the VCO, for example, changes the frequency of the piezoelectric transformer from a high frequency to a low frequency (or vice versa). The VCO controls the rising time and amount of the output voltage by controlling the change amount of the frequency. Therefore, as a desired voltage becomes higher, the change amount of the frequency becomes larger, thereby prolonging the rising time. In the high voltage power supplying apparatus of an image forming apparatus, for example, as the rising time becomes long, a time taken to start up the apparatus also becomes long. This may prolong a time necessary for preparing for image formation.

SUMMARY OF THE INVENTION

The present invention is characterized by solving at least one of the above and other problems. For example, the present invention is characterized by improving the rising characteristics of an output voltage in a power supplying apparatus adopting a piezoelectric transformer to shorten a rising time. Note that other problems will be understood from the entire specification.

The present invention provides a high voltage power supplying apparatus comprising: a pulse generation unit which generates a pulse signal with a predetermined frequency; a piezoelectric transformer which outputs a voltage in accordance with the frequency of the pulse signal; a detection unit which detects an output voltage of the piezoelectric transformer; a control unit which controls the pulse generation unit to change the frequency of the pulse signal by a predetermined value towards a frequency corresponding to a target voltage until the output voltage becomes equal to the target voltage; and a storage unit which stores data indicating the frequency when the output voltage reaches the target voltage, wherein the control unit controls the output voltage to be equal to the target voltage by variably controlling the frequency of the pulse signal by a value smaller than the predetermined frequency from the frequency corresponding to the data stored in the storage unit.

The present invention further provides an image forming apparatus, comprising: an image forming unit which forms an image; a high voltage power supplying apparatus which applies a high voltage to the image forming unit, and has a pulse generation unit that generates a pulse signal with a predetermined frequency, a piezoelectric transformer that outputs a voltage in accordance with the frequency of the pulse signal, and a detection unit that detects an output voltage of the piezoelectric transformer; a control unit which controls the pulse generation unit to change the frequency of the pulse signal by a predetermined value until the output voltage becomes equal to a target voltage; and a storage unit which stores data indicating the frequency when the output voltage reaches the target voltage, wherein the control unit controls the output voltage to be equal to the target voltage by variably controlling the frequency of the pulse signal by a value smaller than the predetermined frequency from the frequency corresponding to the data stored in the storage unit.

Further features of the present invention will become apparent from the following description of exemplary embodiments (with reference to the attached drawings).

BRIEF DESCRIPTION OF THE DRAWINGS

FIGS. 2A and 2B are timing charts showing each main signal according to the embodiment;

DESCRIPTION OF THE EMBODIMENTS

The first embodiment of the present invention will be described first.

The present invention switches, step by step, the frequency of a pulse signal to be sent to a piezoelectric transformer, detects a voltage output from the piezoelectric transformer for each frequency, and determines a frequency at which the detected voltage becomes equal to a predetermined target voltage. This operation will be referred to as sweep operation. Note that the target voltage is set as a voltage needed by a load supplied with a voltage by a high voltage power supplying apparatus. For an image forming apparatus such as a color laser printer, target loads are a charging unit for charging an image carrier, a developing unit for developing a latent image formed on the image carrier, and a transfer unit for transferring a toner image formed on the image carrier onto a printing paper sheet. High voltages to be output to these loads correspond to a charging bias, a developing bias, and a transfer bias.

Figure 1:
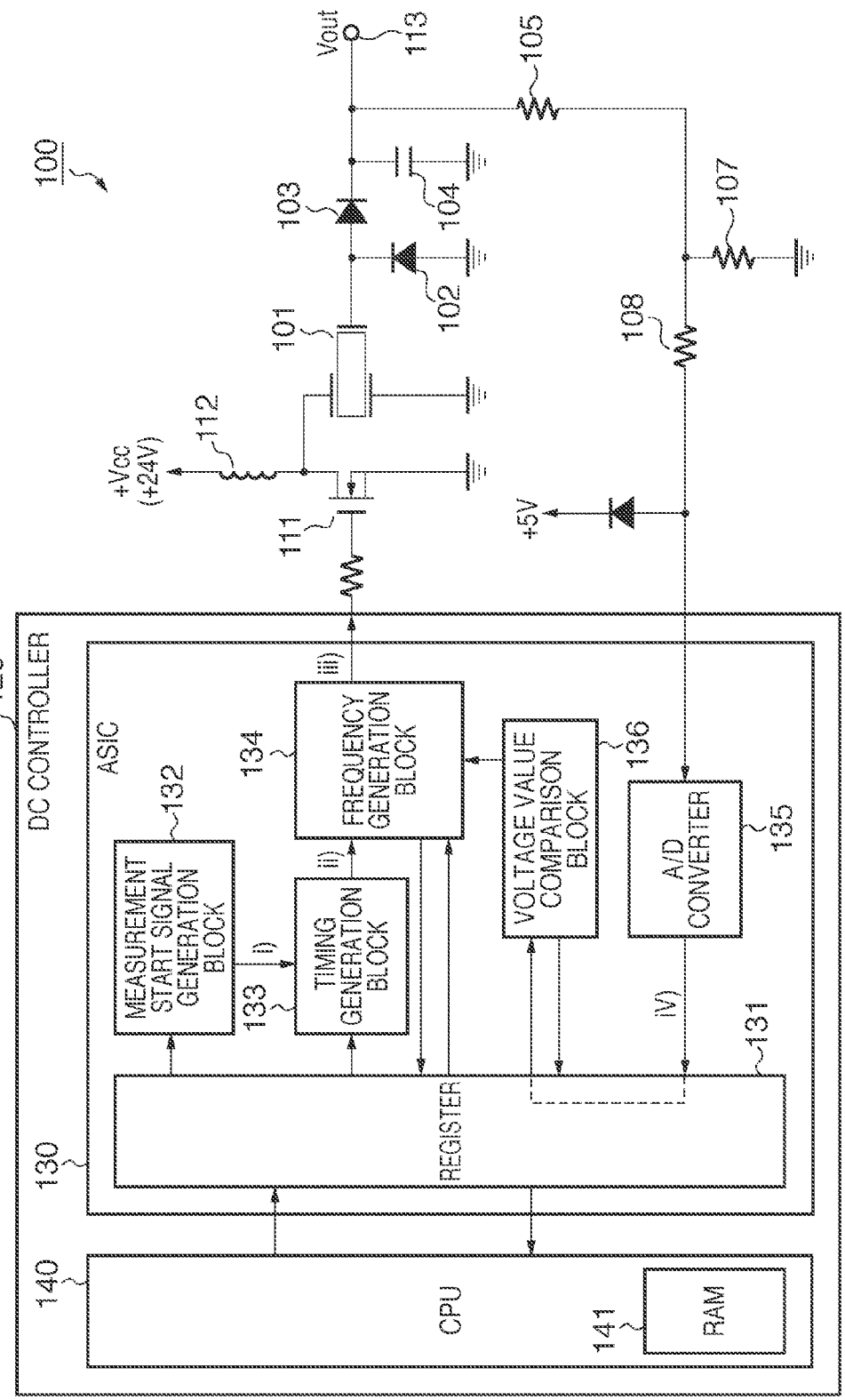
FIG. 1 is a block diagram showing a high voltage power supplying apparatus using a piezoelectric transformer according to an embodiment.

FIG. 1 is a block diagram showing an example of a high voltage power supplying apparatus 100 according to this embodiment. A DC controller 120 serves as a control unit that controls direct current (DC) supply to loads, and are mainly formed by an ASIC 130 and a CPU 140. ASIC is an abbreviation for "Application Specific Integrated Circuit". A piezoelectric transformer 101 outputs a voltage corresponding to the frequency of a pulse signal.

The piezoelectric transformer 101 outputs a voltage corresponding to the frequency of a pulse signal supplied from the ASIC 130. In general, the high voltage power supplying apparatus controls the output voltage of the piezoelectric transformer 101 by the oscillation frequency of a pulse oscillated by an analog circuit including a voltage-controlled oscillator (VCO) connected to the piezoelectric transformer 101. The VCO particularly controls the rising amount and time of the output voltage by controlling the change amount of the frequency. Therefore, as a desired voltage becomes higher, the rising time becomes longer. On the contrary, in the first embodiment, the ASIC 130 generates a pulse signal, and supplies it to the piezoelectric transformer 101. In this way, forming a frequency generation unit and control unit by digital circuits makes it possible to shorten the rising time of the output voltage.

The ASIC 130 forms a feedback control circuit so as to detect a voltage output from the piezoelectric transformer 101. The ASIC 130 acquires a target voltage value output from the CPU 140, and supplies the piezoelectric transformer 101 with a pulse signal with a frequency corresponding to the acquired target voltage value. The pulse signal output from the ASIC 130 is input to the base terminal (gate terminal) of a transistor 111. The collector terminal (drain terminal) of the transistor 111 is connected to a positive power supply voltage Vcc via an inductor 112. The emitter terminal (source terminal) of the transistor 111 is grounded. The collector terminal of the transistor 111 is also connected to the primary side terminal of the piezoelectric transformer 101. The primary side terminal of the piezoelectric transformer 101 has a capacitance. The transistor 111 performs switching operation in accordance with the pulse signal supplied by the ASIC 130. The inductor 112 and the primary side terminal generate a high voltage by stepping up an input voltage by an LC resonant circuit by the capacitance. The generated high voltage is supplied as a pulse signal to the primary side of the piezoelectric transformer 101. The piezoelectric transformer 101 oscillates in response to the pulse signal supplied to the primary side, and generates, on the secondary side, an alternating current (AC) voltage, which has been amplified at a step-up ratio corresponding to the size of the piezoelectric transformer 101.

A rectification unit is connected to the next stage of the piezoelectric transformer 101. That is, the output terminal of the piezoelectric transformer 101 is connected to the cathode terminal of a rectifier diode 102 and the anode terminal of a rectifier diode 103. One terminal of a smoothing capacitor 104 is connected to the cathode terminal of the diode 103, and grounded. The other terminal of the smoothing capacitor 104 is grounded. The diodes 102 and 103 form a rectifier circuit. The AC voltage output from the output terminal of the piezoelectric transformer 101 is rectified and smoothed by the rectifier circuit and the capacitor 104, and then supplied to loads through an output terminal 113.

A voltage detection unit is provided to detect the output voltage of the piezoelectric transformer 101. The arrangement of the voltage detection unit is as follows. The output terminal 113 is connected to one terminal of a resister 105. The other terminal of the resister 105 is connected to one terminal of a resister 107 and one terminal of a resister 108. The other terminal of the resister 108 is connected to a reference voltage source (for example, +5V) for supplying a reference voltage. The other terminal of the resister 107 is grounded. The other terminal of the resister 108 is also connected to the input terminal (an A/D converter 135) of the ASIC 130. That is, the resisters 105 and 107 divide the output voltage. The divided voltages are input to the ASIC 130 via the resister 108. The resisters 105 and 107 form a voltage detection circuit. Note that the resister 108 may also be considered as part of the voltage detection circuit. This voltage detection circuit is an example of a unit which detects the output voltage of the piezoelectric transformer.

The internal arrangement of the ASIC 130 will be explained next. A register 131 stores data sent from the CPU 140. A measurement start signal generation block 132 generates a start signal for starting sweep operation based on the data (a value set by the CPU 140) of the register 131. A timing signal generation block 133 starts in response to the start signal sent from the measurement start signal generation block 132, and generates a timing signal indicating a trigger for switching, step by step, the frequency of the pulse signal to be sent to the piezoelectric transformer 101. A frequency generation block 134 is an example of a pulse generation unit which generates a pulse signal with a predetermined frequency. Based on the timing signal sent from the timing signal generation block 133, the frequency generation block 134 generates a pulse signal to be sent to the piezoelectric transformer 101 while switching its frequency. The A/D converter 135 converts an analog signal into a digital signal. Note that a converted digital value is stored in the register 131. A voltage value comparison block 136 compares the digital value stored in the register 131 with the target voltage value, calculates the difference between the digital value and the target voltage value, and then instructs the frequency generation block 134 about a frequency to be sent to the piezoelectric transformer 101 next. In this embodiment, the voltage value comparison block 136 functions as a control unit which controls the pulse generation unit to increase or decrease the frequency of the pulse signal step by step until the output voltage crosses the target voltage set as the target value of the output voltage. Note that there are two examples in which the output voltage crosses the target voltage. In the first example, the output voltage exceeds the target voltage. In the second example, the output voltage falls below the target voltage.

Referring to FIG. 2A, i) shows the output signal of the measurement start signal generation block 132; ii), the output signal of the timing signal generation block 133; (iii), the frequency of a pulse signal output from the frequency generation block 134; and iv), a digital signal generated by the A/D converter 135. For iv), assume that VA<VB<VC<VD.

The CPU 140 sets data to cause the register 131 to start measurement. When this data is set in the register 131, the measurement start signal generation block 132 gives the timing signal generation block 133 a measurement start signal shown in i) shown in FIG. 2A. The timing signal generation block 133 responds to rising of the measurement signal, and sends, to the frequency generation block 134, a timing signal for switching the frequency of a pulse signal to be sent to the piezoelectric transformer 101. A timing signal is as shown in ii). A value, which has been set in the register 131 by the CPU 140, is used as a generation interval t1 at which the timing signal generation block 133 generates a switching timing signal. The frequency generation block 134 starts sweep operation at an initial frequency (for example, 150 KHz) as shown in iii) of FIG. 2A based on the timing signal sent from the timing signal generation block 133. After that, to detect rising of the timing signal, the frequency generation block 134 increases or decreases the frequency step by step by a predetermined change width (to be also referred to as a change amount) (10 KHz, in this embodiment). In the example shown in FIG. 2A, the block 134 increases the frequency. 150 KHz as an initial frequency is the value which has been stored in the register 131 by the CPU 140. The voltage value comparison block 136 determines the change width to be 10 KHz.

While the frequency of a pulse signal to be sent to the piezoelectric transformer 101 is switched, a voltage output from the piezoelectric transformer 101 also changes gradually. As shown in iv) of FIG. 2A, as a voltage output from the piezoelectric transformer 101 changes, a digital value from the A/D converter 135 also changes. The digital value indicating the output voltage is stored in the register 131. To determine whether the output voltage exceeds the target voltage set by the CPU 140, the voltage value comparison block 136 compares the value of the output voltage with that of the target voltage.

Recording a frequency in a RAM 141 when the output voltage exceeds the target voltage will be described next. Once sweep operation starts, the voltage value comparison block 136 controls the frequency generation block 134 to increase or decrease the frequency of a pulse signal step by step by a predetermined change amount until the output voltage is determined to have exceeded the target voltage. When the output voltage value stored in the register 131 is determined to have exceeded the target voltage value, the voltage value comparison block 136 outputs, to the register 131, a signal for reading a frequency currently output from the frequency generation block 134 into the register 131. The frequency generation block 134 writes the value of the frequency of the pulse signal currently sent to the piezoelectric transformer 101 into the register 131, based on the frequency reading signal set in the register 131. The CPU 140 stores, in the RAM 141, the value of the frequency written in the register 131. As described above, each of the register 131 and the RAM 141 functions as a storage unit which stores data indicating a frequency at which the output voltage exceeds the target voltage.

Although in this embodiment, the RAM 141 stores the value of the frequency at which the output voltage exceeds the target voltage, the value of the frequency may remain stored in the register 131. When the frequency value is stored in the RAM 141, the measurement start signal shown in i) falls in the measurement start signal generation block 132. This ends the sweep operation. The sweep operation is performed upon power-on or when the CPU 140 determines it necessary.

Figure 3:
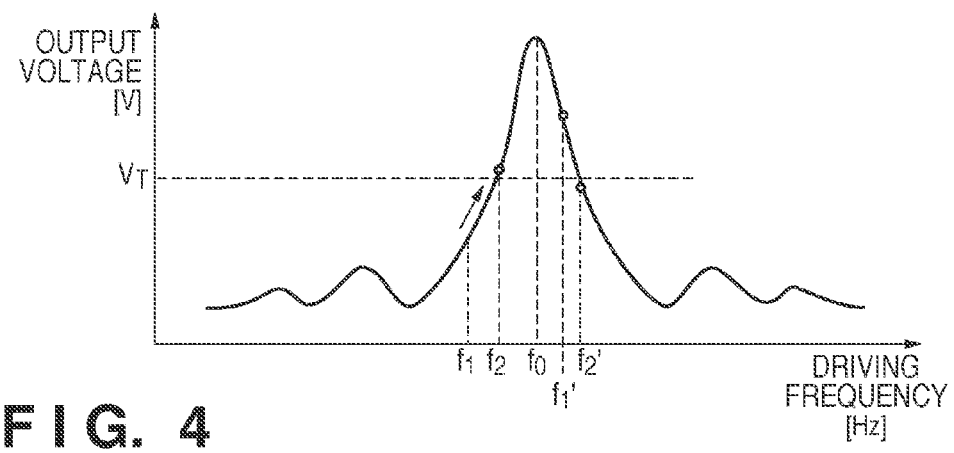
FIG. 3 is a graph showing the characteristics of an output voltage with respect to the frequency of the piezoelectric transformer.

FIG. 3 shows the characteristics of the output voltage with respect to the frequency of the piezoelectric transformer 101. The output voltage reaches maximum at a resonance frequency f0. Therefore, in a frequency region lower than f0, the output voltage rises as the frequency increases. In a frequency region higher than f0, however, the output voltage rises as the frequency decreases. That is, in the left half region, the frequency is increased from an initial frequency f1 step by step, and a frequency f2 when the frequency crosses (exceeds) a target voltage value VT is stored in the RAM 141. On the other hand, in the right half region, the frequency is decreased from an initial frequency f1' step by step, and a frequency f2' when the frequency crosses (falls below) the target voltage value VT is stored in the RAM 141. In the method of performing control by changing the frequency of the output voltage from the piezoelectric transformer, there are resonance points even at frequencies other than the resonance frequency f0. A frequency at a resonance point other than f0 is called a spurious frequency. Since spurious frequencies exist, there is a region where the basic characteristics do not apply. A method of avoiding the spurious frequencies will be described in detail in the second embodiment.

An arrangement for outputting the target voltage based on the frequency value stored in the RAM 141 will be explained with reference to FIGS. 1 and 2B. For descriptive convenience, assume that VE>VF, VF<VH, and VH>VI in FIG. 2B.

v) of FIG. 2B shows a timing signal generated by the timing signal generation block 133. vi) shows the frequency of a pulse signal to be sent to the piezoelectric transformer 101, which is generated by the frequency generation block 134. vii) shows a digital value which is output from the A/D converter 135, and indicates the output voltage of the piezoelectric transformer 101.

The frequency (for example, 200 KHz) stored in the RAM 141 is set as an initial value. The initial value corresponds to a frequency at which the output voltage exceeds the target voltage. The voltage value comparison block 136 sweeps the value of a frequency at which the output voltage is equal to the target voltage by decreasing or increasing, step by step, the frequency from that at which the output voltage exceeds the target voltage. In synchronism with the timing signal shown in v) of FIG. 2B, the frequency generation block 134 decreases the frequency, for example, from 200 KHz to 190 KHz, as shown in vi) of FIG. 2B. The digital value output from the A/D converter 135 at this time decreases from the voltage value VE detected at 200 KHz to the voltage value VF. That is, since a frequency corresponding to a voltage higher than the target voltage VT is set as the initial value, decreasing the frequency brings the output voltage closer to the target voltage.

The voltage value comparison block 136 determines whether the voltage value VF is equal to the target voltage VT. In this case, assume that the output voltage becomes lower than the target voltage VT. Since the output voltage is lower than the target voltage VT, the voltage value comparison block 136 instructs the frequency generation block 134 to increase the frequency. That is, the frequency changes from a decrease to an increase. The frequency generation block 134 changes the frequency from 190 KHz to 195 KHz. Note that the change width here is set smaller than that in the sweep operation. This is because fine adjustment is necessary to sweep a frequency for obtaining the target voltage. As described above, the frequency generation block 134 makes the stepwise change width of the frequency smaller, when the frequency of the pulse signal changes from a decrease to an increase or vice versa to sweep the value of a frequency at which the output voltage is equal to the target voltage.

As shown in vii) of FIG. 2B, the output voltage of the piezoelectric transformer 101 rises from the voltage value VF to the voltage value VH. The voltage value comparison block 136 determines again whether the voltage value VH is equal to the target voltage VT. Assume that the output voltage becomes larger than the target voltage VT.

In this case, the voltage value comparison block 136 instructs the frequency generation block 134 to decrease the frequency. This is done to lower the output voltage. The frequency generation block 134 changes the frequency from an increase to a decrease, and therefore, sets the change width smaller. The frequency generation block 134, for example, changes the frequency from 195 KHz to 192 KHz. The change width is changed from 5 KHz to 3 KHz. That is, the change width becomes smaller.

With this processing, the output voltage of the piezoelectric transformer 101 decreases from the voltage value VH to the voltage value VI, as shown in vii) of FIG. 2B. The voltage value comparison block 136 determines whether the voltage value VI, is equal to the target voltage VT. In this case, since the target voltage VT=VI, the two voltages are determined to be equal to each other. The voltage value comparison block 136 instructs the frequency generation block 134 to continue outputting the pulse signal at the frequency of 192 KHz.

As described above, the voltage value comparison block 136 maintains the output voltage equal to the target voltage by using the data stored in the storage unit to control the pulse generation unit. That is, the value of the frequency for obtaining the target voltage, which has been determined by performing the sweep operation upon power-on, is stored in the RAM 141, and the target voltage is obtained using this value. This makes it possible to shorten the rising time of the output voltage of the piezoelectric transformer 101 as compared with a conventional technique.

The second embodiment of the present invention will be described next.

Figure 4:
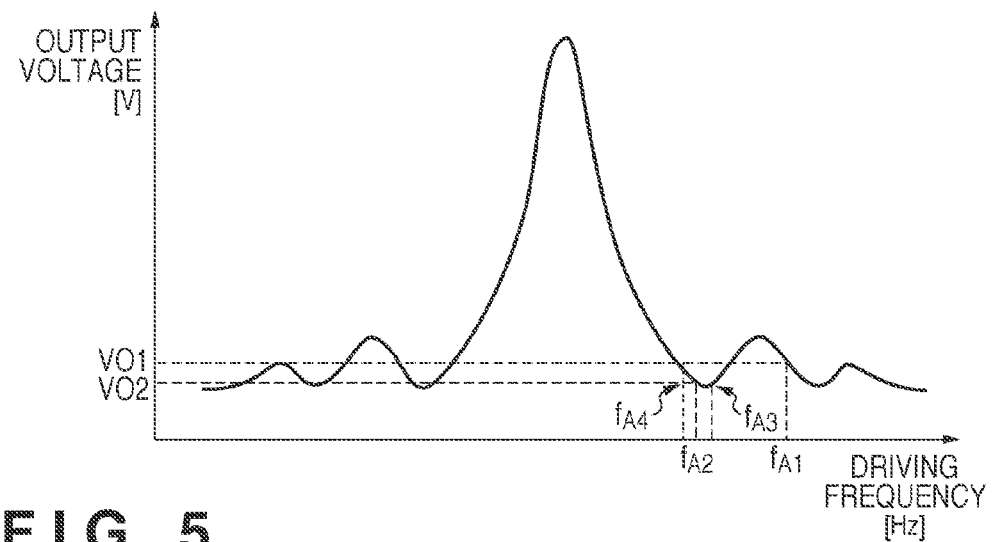
FIG. 4 is a graph showing a case wherein a target voltage falls within a range in which a spurious frequency is generated, with regard to the characteristics of the output voltage with respect to the frequency of the piezoelectric transformer.

This embodiment proposes a method of avoiding the influence of the above-described spurious frequencies. If a target voltage is a low voltage, a spurious frequency is generated due to the structural characteristics of a piezoelectric transformer 101, as shown in FIG. 4. If, for example, a pulse signal with an initial frequency corresponding to the low voltage is input to the piezoelectric transformer 101, the piezoelectric transformer 101 may output a voltage higher than the target voltage. It is, therefore, necessary to detect generation of a spurious frequency, avoid its influence, and store a frequency for obtaining the target voltage in a RAM 141. In the second embodiment, this problem is solved specifically by detecting that an output voltage becomes lower than the target voltage, and then executing sweep operation until the output voltage becomes higher than the target voltage.

FIG. 4 shows a voltage output from the piezoelectric transformer 101 when the frequency of a pulse signal to be sent to the piezoelectric transformer 101 is changed. Reference symbol fA1 denotes an initial frequency for starting weep operation. Referring to FIG. 4, fA1 belongs to a spurious frequency region. Reference symbol VO1 denotes a voltage value output from the piezoelectric transformer 101 with respect to the initial frequency; VO2, a target voltage value; fA2, the frequency of a pulse signal to be sent to the piezoelectric transformer 101 with respect to the target voltage value; fA3, the frequency of a pulse signal which is sent to the piezoelectric transformer 101 when the voltage value of the output voltage of the piezoelectric transformer 101 falls below the target voltage value; and fA4, the frequency of a pulse signal which is sent to the piezoelectric transformer 101 when the voltage value of the output voltage of the piezoelectric transformer 101 exceeds the target voltage value VO2.

When data indicating start of the sweep operation is set in a register 131 by a CPU 140, a measurement start signal generation block 132 sends a measurement start signal to a timing signal generation block 133. Upon input of the measurement start signal, the timing signal generation block 133 generates a timing signal, and sends it to a frequency generation block 134. Each time the frequency generation block 134 receives the timing signal, it switches the frequency of a pulse signal step by step. The initial frequency fA1 of the frequency generation block 134 is a value which has been set in the register 131 by the CPU 140. As in the first embodiment, the CPU 140 determines the initial frequency fA1 in accordance with a voltage needed by a load. The frequency generation block 134 generates and outputs a pulse signal with the set initial frequency fA1. For the initial frequency fA1, a voltage value output from the piezoelectric transformer 101 is VO1, as shown in FIG. 4. A voltage value comparison block 136 determines that the voltage value VO1 is larger than the target voltage value VO2. The voltage value comparison block 136 writes, into the register 131, data indicating that the initial voltage value VO1 is larger than the target voltage value VO2. As described above, the voltage value comparison block 136 functions as a determination unit which determines whether an initial voltage detected by a detection unit when an initial frequency is set in a pulse generation unit exceeds the target voltage.

The CPU 140 detects the value written in the register 131. The CPU 140 instructs the frequency generation block 134 to switch the frequency of a pulse signal to be sent to the piezoelectric transformer 101 until a voltage value larger than the target voltage value VO2 is output after an output voltage value becomes smaller than the target voltage value VO2. That is, the CPU 140 functions as a unit which controls the pulse generation unit to decrease or increase the frequency of the pulse signal from the initial frequency step by step until the output voltage falls below the target voltage. The CPU 140 also functions as a unit which controls the pulse generation unit to increase or decrease the frequency of the pulse signal step by step until the output voltage exceeds the target voltage, once it confirms that the output voltage falls below the target voltage.

Based on the timing signal sent from the timing signal generation block 133, the frequency generation block 134 changes, step by step, the frequency of the pulse signal to be sent to the piezoelectric transformer 101 until a voltage value smaller than the target voltage value VO2 is output. In this example, the frequency decreases step by step. Consequently, when the frequency becomes fA3, the output voltage value becomes smaller than the target voltage value VO2. When the voltage value comparison block 136 detects that the output voltage value becomes smaller than the target voltage value VO2, the frequency generation block 134 keeps on decreasing the frequency. The frequency generation block 134 decreases the frequency of the pulse signal step by step until the voltage value comparison block 136 determines that the output voltage exceeds the target voltage. When the voltage value comparison block 136 detects that the output voltage value becomes larger than the target voltage value VO2, the frequency generation block 134 changes the frequency from a decrease to an increase. The frequency generation block 134 switches the frequency of the pulse signal step by step until the voltage value comparison block 136 determines that the output voltage does not exceed the target voltage. Fine adjustment of the frequency may be implemented by making the change width smaller, for example, by changing the change width of the frequency from 10 KHz to 5 KHz, when changing the frequency from a decrease to an increase When the voltage value comparison block 136 detects that that the output voltage value becomes smaller than the target voltage value VO2 again, the frequency generation block 134 writes the frequency fA4 at this time into the register 131. The CPU 140 stores the value of the frequency fA4 in the RAM 141. Note that an arrangement for continuously outputting the target voltage based on the frequency value stored in the RAM 141 and the frequency recording processing are the same as in the first embodiment, and a description thereof will be omitted.

As described above, according to the second embodiment, it is possible to output a low voltage at high accuracy while avoiding the influence of spurious frequencies.

The third embodiment will now be explained.

In the third embodiment, a method of solving a problem that a voltage value output from a piezoelectric transformer 101 changes when a load change occurs will be described.

That is, in the third embodiment, when a load change is detected, sweep operation is re-executed, thereby solving this problem.

Figure 5:
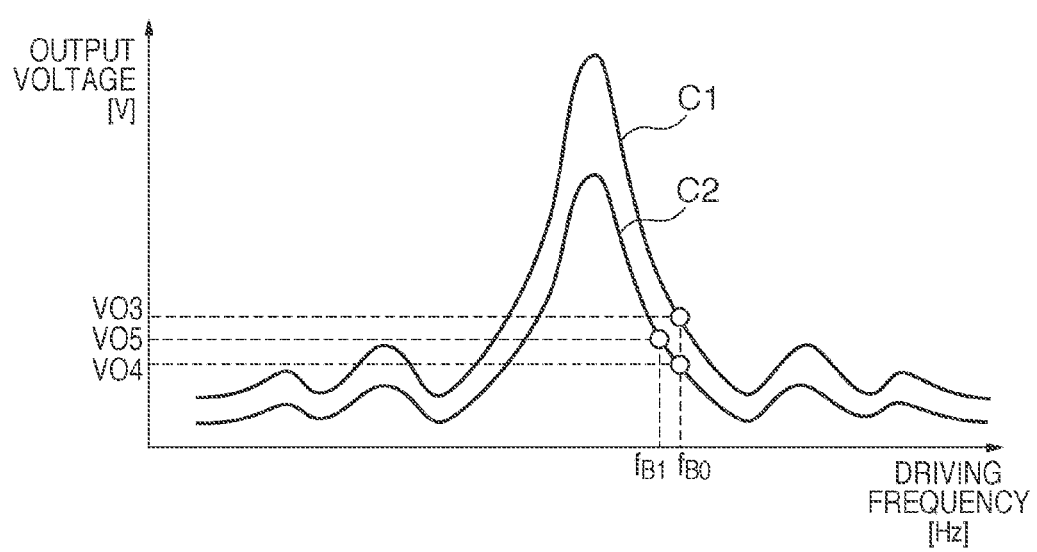
FIG. 5 is a graph showing the relationship between the output voltage and the frequency of the piezoelectric transformer before and after a load change.

FIG. 5 is a view showing the relationships between the output voltage value and frequency of the piezoelectric transformer 101 before and after a load change occurs. A frequency characteristic curve C1 indicates a frequency characteristic before the load change occurs. A frequency characteristic curve C2 represents a frequency characteristic after the load change occurs. Reference symbol fB0 denotes a frequency of a pulse signal with respect to a target voltage before the load change occurs; VO3, an output voltage value with respect to the frequency fB0 before the load change occurs; VO4, an output voltage value with respect to the frequency fB0 after the load change occurs; fB1, the frequency of a pulse signal which is set as an initial value by a CPU 140 when the load change occurs; and VO5, an output voltage value corresponding to the frequency fB1.

The CPU 140 functions as a load detection unit which detects a load change with respect to a high voltage power supplying apparatus. The CPU 140 also detects a load change by direct detection from a load, or by detecting the collapse of the relationship between the frequency and the output voltage. Upon detection of a load change, the CPU 140 re-executes sweep operation. To re-execute sweep operation, the frequency fB0 stored in a RAM 141 is referred. That is, the CPU 140 sets, in a register 131, the frequency fB0 stored in the RAM 141. A frequency generation block 134 outputs a pulse signal in accordance with the frequency fB0 set in the register 131. Based on the voltage value VO4 output from the piezoelectric transformer 101 upon sending the frequency fB0, the CPU 140 determines a frequency to be output next.

If, for example, a load change occurs, as shown in FIG. 5, the output voltage is lower than that before the load change occurs. The CPU 140, therefore, decreases the frequency to raise the output voltage. That is, the CPU 140 sets the frequency fB1 in the register 131. The frequency generation block 134 generates a pulse signal with the frequency fB1, and outputs it to the piezoelectric transformer 101. As shown in FIG. 5, the piezoelectric transformer 101 outputs a voltage with the voltage value VO5. After that, a frequency at which the output voltage exceeds a voltage with the target voltage value VO3 or larger is stored in the RAM 141, as in the first embodiment.

According to the third embodiment, upon detecting a load change, the CPU 140 or the like controls a pulse generation unit to increase or decrease the frequency of the pulse signal step by step until the output voltage exceeds the target voltage again. With this processing, the value of a frequency at which the output voltage is equal to the target voltage is swept. As a result, even if a load change occurs, it is possible to recover the target voltage in an early stage.

Note that the above power supplying apparatus can be adopted as a power supplying apparatus for an image forming apparatus. An electrophotographic image forming apparatus has a latent image forming unit (for example, a charging roller or exposure apparatus) which forms an electrostatic latent image on an image carrier, a developing unit (for example, a developing roller) which develops the electrostatic latent image into a toner image, a transfer unit (for example, a transfer roller) which transfers the toner image onto a transfer material, and a fixing unit (for example, a fixing roller or pressing roller) which heats and fixes the toner image on the transfer member. Particularly, the power supplying apparatus supplies at least one of a charging bias applied to the image carrier, a developing bias applied to the developing unit, and a transfer bias applied to the transfer unit. If the control speed in the power supplying apparatus improves, it is possible to shorten the time from startup of the image forming apparatus until an image is formed on a printing paper sheet and the printing paper sheet is discharged.

Note that it is also possible to configure, as an IC, the ASIC 130 described above in the first to third embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-280951, filed Dec. 10, 2009, and No. 2010-261727, filed Nov. 24, 2010, which are hereby incorporated by reference herein in their entirety.

What is claimed is:

1. A high voltage power supplying apparatus comprising:
    a signal generation unit which generates a drive signal with a predetermined frequency;
    a piezoelectric transformer which outputs a voltage in accordance with a frequency of the drive signal;
    a detection unit which detects an output voltage of said piezoelectric transformer; and
    a control unit which controls said signal generation unit to change the frequency of the drive signal so that an output voltage of said piezoelectric transformer becomes a target voltage,
    wherein said control unit is configured to change the frequency of the drive signal by a first predetermined value until an output voltage of the piezoelectric transformer is greater than a target voltage or the output voltage of the piezoelectric transformer is smaller than the target voltage, and to further change the frequency of the drive signal by a second predetermined value, smaller than the first predetermined value, after the output voltage is greater than the target voltage or the output voltage is smaller than the target voltage.

2. The apparatus according to claim 1, further comprising a storage unit which stores data indicating the frequency of the drive signal when the output voltage becomes greater than or smaller than the target voltage,
    wherein said control unit controls the frequency of the drive signal so that the output voltage becomes the target voltage, by decreasing or increasing the frequency step by step from the frequency corresponding to the data stored in said storage unit.

3. The apparatus according to claim 1, further comprising:
    a determination unit which determines whether an initial voltage detected by said detection unit exceeds the target voltage when said control unit sets an initial frequency in said signal generation unit,
    wherein said control unit controls the frequency of the signal generated by said signal generation unit to decrease or increase the frequency of the drive signal step by step from the initial frequency until the output voltage falls below the target voltage, and controls, when confirming that the output voltage falls below the target voltage, the frequency of the drive signal so that the output voltage becomes equal to the target voltage, by controlling said signal generation unit to increase or decrease the frequency of the drive signal step by step from a frequency at which the output voltage falls below the target voltage until the output voltage exceeds the target voltage.

4. The apparatus according to claim 1, further comprising:
a load detection unit which detects a load change for said apparatus,
wherein when the load change is detected, said control unit controls said signal generation unit to increase or decrease the frequency of the drive signal so that the output voltage becomes equal to the target voltage again.

5. The apparatus according to claim 1, wherein said control unit makes a change amount of the frequency of the drive signal smaller when changing the frequency from a decrease to an increase or from an increase to a decrease in order to sweep a frequency at which the output voltage is equal to the target voltage.

6. An image forming apparatus, comprising:
an image forming unit which forms an image;
a high voltage power supplying apparatus which applies a high voltage to said image forming unit, and has a signal generation unit that generates a drive signal with a predetermined frequency, a piezoelectric transformer that outputs a voltage in accordance with the frequency of the drive signal, and a detection unit that detects an output voltage of said piezoelectric transformer; and
a control unit which controls said signal generation unit to change the frequency of the drive signal so that an output voltage of said piezoelectric transformer becomes a target voltage,
wherein said control unit is configured to change the frequency of the drive signal by a first predetermined value until an output voltage of said piezoelectric transformer is greater than a target voltage or the output voltage of said piezoelectric transformer is smaller than the target voltage and to further change the frequency of the drive signal by a second predetermined value, smaller than the first predetermined value, after the output voltage is greater than the target voltage or the output voltage is smaller than the target voltage.

7. The apparatus according to claim 6, further comprising a storage unit which stores data indicating the frequency of the drive signal after the output voltage becomes greater than or smaller than the target voltage,
wherein said control unit controls the frequency of the drive signal so that the output voltage becomes equal to the target voltage, by decreasing or increasing the frequency step by step from the frequency corresponding to the data stored in said storage unit.

8. The apparatus according to claim 6, comprising:
a determination unit which determines whether an initial voltage detected by said detection unit exceeds the target voltage when said control unit sets an initial frequency in said signal generation unit,
wherein said control unit controls the frequency of the drive signal generated by said signal generation unit to decrease or increase the frequency of the drive signal step by step from the initial frequency until the output voltage falls below the target voltage, and controls, when confirming that the output voltage falls below the target voltage, the frequency of the drive signal so that the output voltage becomes equal to the target voltage, by controlling said signal generation unit to increase or decrease the frequency of the drive signal step by step from a frequency at which the output voltage falls below the target voltage until the output voltage exceeds the target voltage.

9. The apparatus according to claim 6, further comprising:
a load detection unit which detects a load change for said high voltage power supplying apparatus,
wherein when the load change is detected, said control unit controls said signal generation unit to increase or decrease the frequency of the drive signal so that the output voltage becomes equal to the target voltage again.

10. The apparatus according to claim 6, wherein said control unit makes a change amount of the frequency of the drive signal smaller when changing the frequency from a decrease to an increase or from an increase to a decrease in order to sweep a frequency at which the output voltage is equal to the target voltage.

11. The apparatus according to claim 6, wherein said image forming unit has an image carrier, a charging unit which charges said image carrier, a latent image forming unit which forms an electrostatic latent image on said image carrier, a developing unit which develops the electrostatic latent image into a toner image, a transfer unit which transfers the toner image onto a transfer material, and a fixing unit which heats and fixes the toner image on the transfer material, and
said high voltage power supplying apparatus applies a high voltage to one of said charging unit, said developing unit, and said transfer unit.

12. A high voltage power supplying apparatus comprising:
a signal generation unit which generates a drive signal;
a piezoelectric transformer which outputs a voltage in accordance with a frequency of the drive signal; and
a control unit which controls the frequency of the drive signal so that an output voltage of the piezoelectric transformer becomes a target voltage,
wherein the control unit is configured to change the frequency of the drive signal by a first predetermined value until the frequency of the drive signal corresponding to the output voltage is lower than the frequency of the drive signal corresponding to the target voltage or the frequency of the drive signal corresponding to the output voltage is higher than the frequency of the drive signal corresponding to the target voltage, and to change the frequency of the drive signal by a second predetermined value smaller than the first predetermined value after the frequency of the drive signal corresponding to the output voltage is lower than the frequency of the drive signal corresponding to the target voltage or the frequency of the drive signal corresponding to the output voltage is higher than the frequency of the drive signal corresponding to the target voltage.

13. The high voltage power supplying apparatus according to claim 12, further comprising a storage unit which stores data indicating the frequency of the drive signal when the output voltage becomes higher than or lower than the target voltage.

14. An image forming apparatus, comprising:
an image forming unit which forms an image; and
a high voltage power supplying part which applies a high voltage to said image forming unit, including:
a signal generation unit which generates a drive signal; and
a piezoelectric transformer which outputs a voltage in accordance with a frequency of the drive signal;
a control unit which controls the frequency of the drive signal so that an output voltage of the piezoelectric transformer becomes a target voltage,
wherein the control unit is configured to change the frequency of the drive signal by a first predetermined value until the frequency of the drive signal corresponding to the output voltage is lower than the frequency of the drive signal corresponding to the target voltage or the frequency of the drive signal corresponding to the output voltage is higher than the frequency of the drive signal corresponding to the target voltage, and to change the frequency of the drive signal by a second predetermined value smaller than the first predetermined value after the frequency of the drive signal corresponding to the output voltage is lower than the frequency of the drive signal corresponding to the target voltage or the frequency of the drive signal corresponding to the output voltage is higher than the frequency of the drive signal corresponding to the target voltage.

15. The image forming apparatus according to claim 14, further comprising a storage unit which stores data indicating the frequency of the drive signal when the output voltage becomes higher than or lower than the target voltage.

16. The image forming apparatus according to claim 14,
wherein said image forming unit has an image carrier, a charging unit which charges said image carrier, a latent image forming unit which forms an electrostatic latent image on said image carrier, a developing unit which develops the electrostatic latent image into a toner image, a transfer unit which transfers the toner image onto a transfer material, and a fixing unit which heats and fixes the toner image on the transfer material, and
wherein said high voltage power supplying apparatus applies a high voltage to one of said charging unit, said developing unit, and said transfer unit.

17. A high voltage power supplying apparatus comprising:
a signal generation unit which generates a drive signal;
a piezoelectric transformer which outputs a voltage in accordance with a frequency of the drive signal; and
a control unit which controls the frequency of the drive signal so that an output voltage of the piezoelectric transformer becomes a target voltage,
wherein said control unit is configured to switch from a first mode in which the frequency of the drive signal is change by a first predetermined value to a second mode in which the frequency of the drive signal is change by a second predetermined value being smaller than the first predetermined value so as to change the frequency of the drive signal from an initial frequency to a frequency corresponding to the target voltage.

18. The high voltage power supplying apparatus according to claim 17, further comprising: a storage unit configure to store the initial frequency.

19. An image forming apparatus, comprising:
an image forming unit which forms an image; and
a high voltage power supplying part which applies a high voltage to said image forming unit, including:
a signal generation unit which generates a drive signal;
a piezoelectric transformer which outputs a voltage in accordance with a frequency of the drive signal; and
a control unit which controls the frequency of the drive signal so that an output voltage of the piezoelectric transformer becomes a target voltage,
wherein said control unit is configured to switch from a first mode in which the frequency of the drive signal is change by a first predetermined value to a second mode in which the frequency of the drive signal is change by a second predetermined value being smaller than the first predetermined value so as to change the frequency of the drive signal from an initial frequency to a frequency corresponding to the target voltage.

20. The high voltage power supplying apparatus according to claim 19, further comprising:
a storage unit configure to store the initial frequency.

* * * * *